(12) United States Patent
Parikh et al.

(10) Patent No.: US 12,315,735 B2
(45) Date of Patent: May 27, 2025

(54) METHODS FOR REMOVING ETCH STOP LAYERS

(71) Applicant: Applied Materials, Inc., Santa Clara, CA (US)

(72) Inventors: Suketu Parikh, San Jose, CA (US); Andrew Yeoh, Portland, OR (US); Tom S. Choi, Santa Clara, CA (US); Joung Joo Lee, San Jose, CA (US); Nitin K. Ingle, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 567 days.

(21) Appl. No.: 17/858,371

(22) Filed: Jul. 6, 2022

(65) Prior Publication Data

US 2023/0035288 A1 Feb. 2, 2023

Related U.S. Application Data

(60) Provisional application No. 63/228,068, filed on Jul. 31, 2021.

(51) Int. Cl.
*H01L 21/311* (2006.01)
*H01L 21/02* (2006.01)
*H01L 21/768* (2006.01)

(52) U.S. Cl.
CPC .. *H01L 21/31116* (2013.01); *H01L 21/02274* (2013.01); *H01L 21/31138* (2013.01);
(Continued)

(58) Field of Classification Search
CPC ......... H01L 21/31116; H01L 21/02274; H01L 21/31138; H01L 21/76807;
(Continued)

(56) References Cited

U.S. PATENT DOCUMENTS 6,323,121 B1 11/2001 Liu et al.
9,997,457 B2 6/2018 Jezewski et al.
(Continued)

FOREIGN PATENT DOCUMENTS

CN 112725762 A 4/2021
WO WO 2020/161256 A1 8/2020

OTHER PUBLICATIONS

PCT International Search Report and Written Opinion for PCT/US2022/074149 dated Nov. 16, 2022.
(Continued)

*Primary Examiner* — Kyoung Lee
*Assistant Examiner* — Sophia W Kao
(74) *Attorney, Agent, or Firm* — Moser Taboada

(57) ABSTRACT

Methods open etch stop layers in an integrated environment along with metallization processes. In some embodiments, a method for opening an etch stop layer (ESL) prior to metallization may include etching the ESL with an anisotropic process using direct plasma to form helium ions that are configured to roughen the ESL for a first duration of approximately 10 seconds to approximately 30 seconds, forming aluminum fluoride on the ESL using remote plasma and nitrogen trifluoride gas for a second duration of approximately 10 seconds to approximately 30 seconds, and exposing the ESL to a gas mixture of boron trichloride, trimethylaluminum, and/or dimethylaluminum chloride at a temperature of approximately 100 degrees Celsius to approximately 350 degrees Celsius to remove aluminum fluoride from the ESL and a portion of a material of the ESL for a third duration of approximately 30 seconds to approximately 60 seconds.

20 Claims, 7 Drawing Sheets

(52) U.S. Cl.
CPC .. *H01L 21/76807* (2013.01); *H01L 21/76826* (2013.01); *H01L 21/76829* (2013.01)

(58) Field of Classification Search
CPC ......... H01L 21/76826; H01L 21/76829; H01L 21/67184; H01L 21/76843; H01L 21/76844; H01L 21/31122; H01L 21/67069; H01L 21/67028; H01L 21/67207; H01L 21/67253; H01J 37/32357; H01J 37/32422
See application file for complete search history.

(56) References Cited

U.S. PATENT DOCUMENTS

| | | | |
|---|---|---|---|
| 10,438,847 | B2 | 10/2019 | Lai et al. |
| 10,818,589 | B2 | 10/2020 | Amanapu et al. |
| 2005/0118085 | A1 | 6/2005 | Satchell |
| 2005/0148147 | A1 | 7/2005 | Keating et al. |
| 2015/0079799 | A1* | 3/2015 | Nemani ............ H01L 21/76807 438/714 |
| 2015/0262869 | A1 | 9/2015 | Naik et al. |
| 2017/0062288 | A1 | 3/2017 | Hanawa et al. |
| 2017/0125418 | A1* | 5/2017 | Park ..................... H01L 21/302 |
| 2019/0348274 | A1 | 11/2019 | Park et al. |
| 2020/0035551 | A1 | 1/2020 | Kosaka et al. |
| 2020/0043799 | A1 | 2/2020 | Lee et al. |
| 2021/0066122 | A1* | 3/2021 | Lin ................... H01L 21/28562 |
| 2021/0119128 | A1 | 4/2021 | Zhang |

OTHER PUBLICATIONS

PCT International Search Report and Written Opinion for PCT/US2022/074152 dated Nov. 15, 2022.

Aniruddha Joi, Rohan Akolkar, and Uziel Landau, Pulse Electrodeposition of Copper-Manganese Alloy for Application in Interconnect Metallization, Journal of The Electrochemical Society, 160 (12) D3145-D3148 (2013), Case Western Reserve University, Cleveland, Ohio 44106, USA, 5 pages (D3145-D3148).

Cheng-Han Lee and Ren-Kae Shiue, Mechanism and improvements of Cu voids under via bottom, Department of Materials Science and Engineering, National Taiwan University, Taiwan, ROC, Semiconductor Digest News and Industry Trends, https://sst.semiconductor-digest.com/, pp. 1 of 14.

* cited by examiner

METHODS FOR REMOVING ETCH STOP LAYERS

CROSS-REFERENCE TO RELATED APPLICATIONS

This application claims benefit of U.S. provisional patent application Ser. No. 63/228,068, filed Jul. 31, 2021, which is herein incorporated by reference.

FIELD

Embodiments of the present principles generally relate to semiconductor processing of semiconductor substrates.

BACKGROUND

During metallization processes, vias are formed into substrates to allow for electrical connections between semiconductor structures. When the vias are opened, the underlying metal materials are exposed to oxygen and moisture. The atmospheric exposure, along with residual chemistry used to open the vias, cause oxidation and corrosion of the metal materials. As such, a maximum exposure time or queue time begins the moment that the vias are opened. The substrates must be processed within the queue time or the substrate becomes unusable, decreasing yields. Wet cleaning processes are required to adequately remove any oxidation or corrosion from the metal materials before further metallization processes can be performed.

Accordingly, the inventors have provided improved processes that eliminate queue times altogether along with wet cleaning processes, increasing the performance of the metallization while also increasing throughput.

SUMMARY

Methods for improving metallization processes while eliminating queue times are provided herein.

In some embodiments, a method for opening an etch stop layer prior to metallization may comprise etching the etch stop layer with an anisotropic process using direct plasma to form helium ions that are configured to roughen the etch stop layer, forming aluminum fluoride on the etch stop layer using remote plasma and nitrogen trifluoride gas, and exposing the etch stop layer to a gas mixture at a temperature of approximately 100 degrees Celsius to approximately 350 degrees Celsius to remove aluminum fluoride from the etch stop layer reducing a thickness of a portion of a material of the etch stop layer.

In some embodiments, the method may further include wherein the gas mixture is one or more of boron trichloride, trimethylaluminum, and dimethylaluminum chloride, repeating the method for opening the etch stop layer three to five times, etching the etch stop layer for a first duration of approximately 10 seconds to approximately 30 seconds, forming aluminum fluoride on the etch stop layer for a second duration of approximately 10 seconds to approximately 30 seconds, exposing the etch stop layer to the gas mixture for a third duration of approximately 30 seconds to approximately 60 seconds, exposing the etch stop layer to the gas mixture without plasma or ions such that corrosion on the etch stop layer is inhibited, after opening the etch stop layer, using hydrogen gas and/or water passivation on a metal surface exposed by opening the etch stop layer to prevent corrosion of the metal surface, wherein the etch stop layer is aluminum monoxide or silicon carbon nitride, performing metallization processes after the etch stop layer is opened, opening the etch stop layer and performing the metallization processes without a vacuum break in an integrated tool, detecting the opening of the etch stop layer using at least one onboard metrology sensor in the integrated tool, and/or repeating the method after exposing the etch stop layer to the gas mixture if an onboard metrology sensor does not detect the opening of the etch stop layer and stopping the method after exposing the etch stop layer to the gas mixture if the onboard metrology sensor detects the opening of the etch stop layer.

In some embodiments, a method for etching a layer prior to metallization may comprise amorphizing the layer with an anisotropic process using direct plasma to form neutral ions that are configured to form an amorphous layer, exposing the amorphous layer with radicals using remote plasma and a first gas mixture in an isotropic process, wherein the radicals selectively react with the amorphous layer to form a reaction layer, and exposing the reaction layer to a second gas mixture without plasma at a temperature of approximately 100 degrees Celsius to approximately 350 degrees Celsius to remove the reaction layer and reducing a thickness of the layer.

In some embodiments, the method may further include wherein the first gas mixture is AlF, SINF, SiNCl, or SiOF based chemistries and the second gas mixture is AlF, AlF vapor, $AlFCH_3$, or AlClF based chemistries, repeating the method for etching a layer three to five times, performing metallization processes after the layer is etched, etching the layer and performing the metallization processes without a vacuum break in an integrated tool, and/or repeating the method after exposing the reaction layer to the second gas mixture if an onboard metrology sensor does not detect that an etching goal has been achieved and stopping the method after exposing the reaction layer to the second gas mixture if the onboard metrology sensor detects the etching goal has been achieved.

In some embodiments, non-transitory, computer readable medium having instructions stored there on that, when executed, cause a method to be performed, the method may comprise etching the etch stop layer with an anisotropic process using direct plasma to form helium ions that are configured to roughen the etch stop layer for a first duration of approximately 10 seconds to approximately 30 seconds, forming aluminum fluoride on the etch stop layer using remote plasma and nitrogen trifluoride gas for a second duration of approximately 10 seconds to approximately 30 seconds, and exposing the etch stop layer to a gas mixture at a temperature of approximately 100 degrees Celsius to approximately 350 degrees Celsius to remove aluminum fluoride from the etch stop layer reducing a thickness of a portion of a material of the etch stop layer for a third duration of approximately 30 seconds to approximately 60 seconds.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
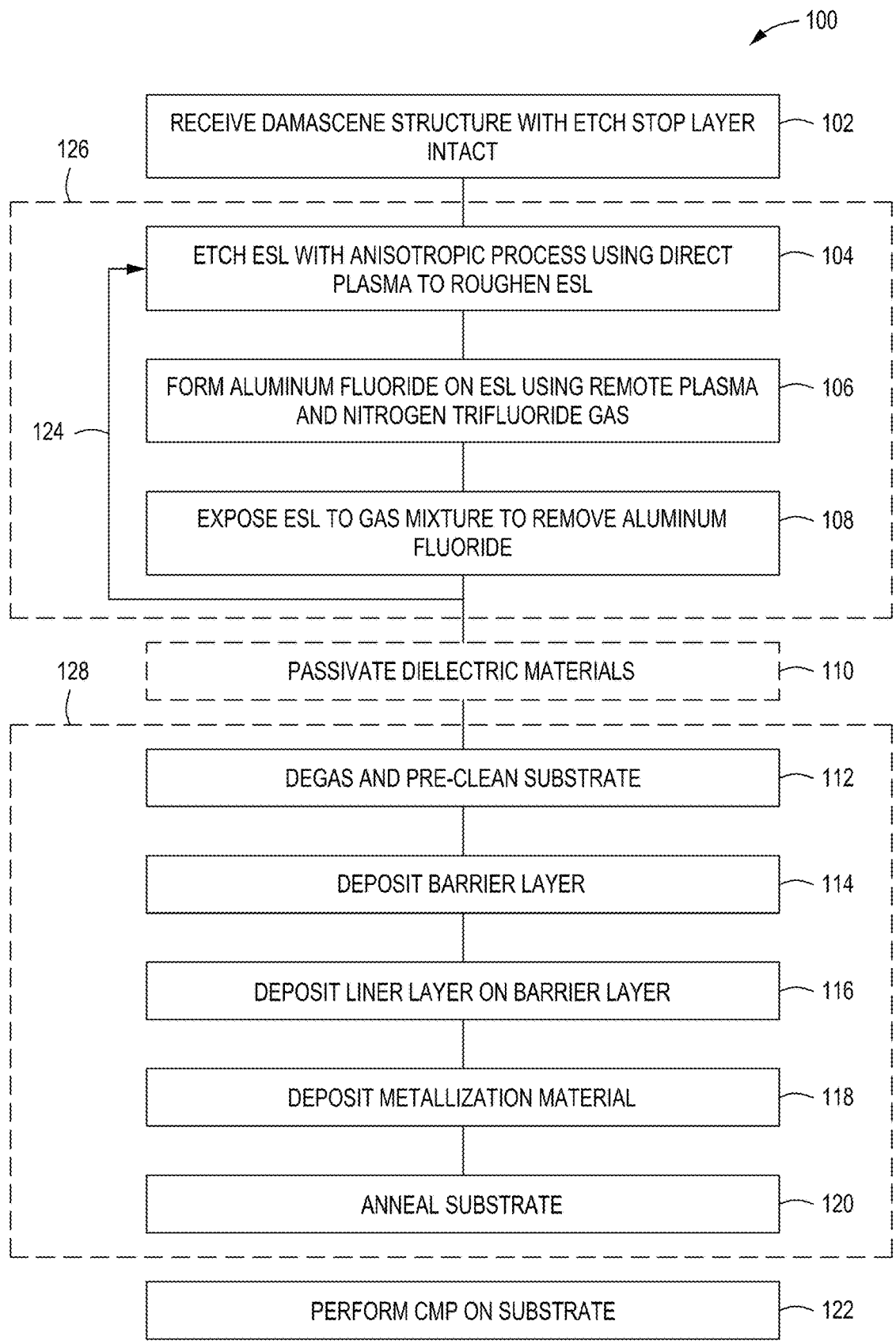
FIG. 1 is a method of etch stop removal and metallization damascene structures on a substrate in accordance with some embodiments of the present principles.
Figure 2:
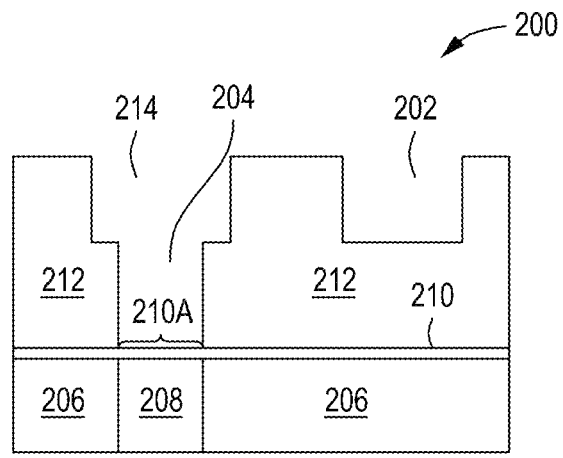
FIG. 2 depicts a cross-sectional view of a dual damascene via and line with an etch stop layer present in a bottom of the via in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide processes and integrated tools which eliminate the very critical queue ("Q") time and environmental exposure found in traditional etch stop open and metallization processes. Wet cleaning is also removed from the process flows. The methods provide pre-cleaning of underlying metal with reduced low K damage. With traditional processes, the Q time after the etch stop open and metallization is critical as polymer residue and moisture corrode the underlying metals such as copper, cobalt, and tungsten, forming metal oxides and metal oxy-fluorides. The contamination of the underlying metals leads to poor interfaces which contribute to high via resistance and/or via opens that impact yields. The present methods and apparatus provide integrated tools that perform etch stop open to underlying metals combined with dry pre-clean and metallization processes. The metallization processes may include deposition of selective barriers (self-aligned monolayers (SAM) plus barrier layer), liner layers, and metal gapfill. The processes may include deposition of metals such as, but not limited to, cobalt, ruthenium, and/or molybdenum, and the like to form interconnects. The methods of the present principles have the advantage of improving via yield by the elimination of the Q time, reducing via resistance through cleaner metal interfaces, and increasing throughput by reducing the number of processes and the timing of processes in the work flow (e.g., wet clean and Q time are eliminated).

Traditional damascene or dual damascene process flows form trenches and/or vias in preparation for metallization processes to complete interconnects on the substrate. One of the traditional processes in the damascene formation flow is to open the etch stop used to create the vias. Once open, the exposed underlying metal begins to corrode and oxidize. The methods and apparatus of the present principles allow the damascene flows to be altered such that the vias are not opened (etch stop layer remains) in the damascene formation flow. In FIG. 1, a method 100 of opening an etch stop layer of a via in a metallization compatible process is depicted. The method 100 allows the opening of the etch stop layer to be performed in an integrated tool used for metallization processes, eliminating the Q time from the damascene formation flows and eliminating the exposure of the underlying metal to the environment. FIGS. 2-9 are used to further illustrate method 100.

In block 102 of method 100, a substrate with at least one damascene structure is received with an etch stop layer remaining intact. In a view 200 of FIG. 2A, a dual damascene structure, for example, is depicted with a first trench, 214, a second trench 202, and a via 204 formed in a substrate. The substrate includes a first dielectric layer 206 and underlying metallization material 208 which remains protected from exposure to the atmosphere by an etch stop layer 210 at the bottom of the via 204. A second dielectric layer 212 includes the via 204, the first trench 214, and the second trench 202. Portions of the method 100 may use direct and/or remote plasma. The remote plasma may be generated by more traditional remote plasma reactors that are configured separately from a chamber that holds the substrate and/or may be generated by reactors that possess both the capability to form remote plasma and direct plasma within the same reactor chamber that holds the substrate. For the sake of brevity, and not meant to be limiting, references will be made to a reactor that possesses both remote and direct plasma capabilities as described below for FIG. 11.

Figure 3:
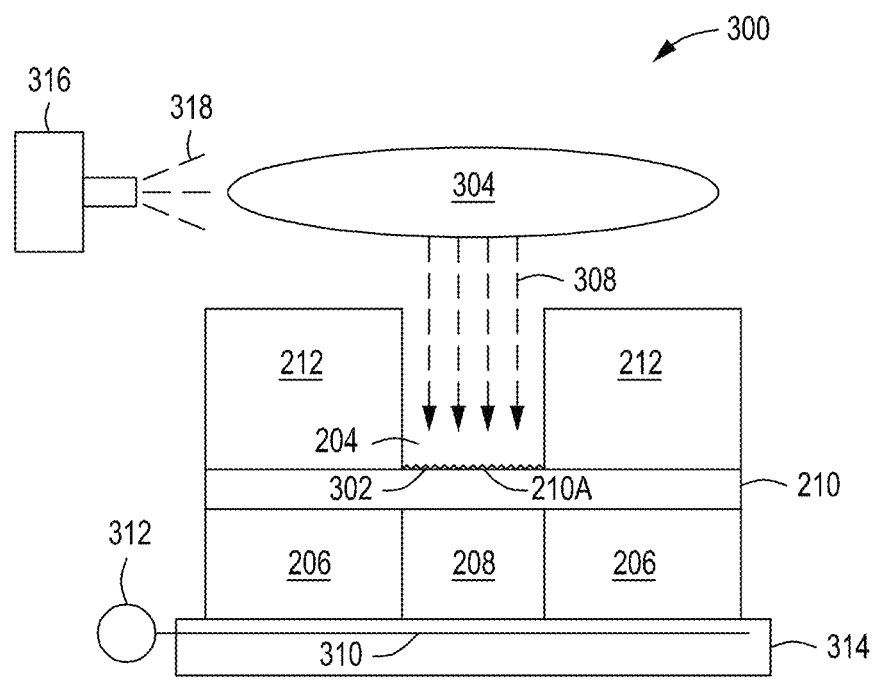
FIG. 3 depicts a cross-sectional view of roughening a portion of an etch stop layer in a bottom of a via in accordance with some embodiments of the present principles.

In block 104, a portion 210A of the etch stop layer 210 at the bottom of the via 204 is etched with an anisotropic process using direct plasma 304 in order to roughen 302 the portion 210A of the etch stop layer 210 as depicted in a view 300 of FIG. 3. The roughening of the portion 210A of the etch stop layer 210 increases the exposed surface area to allow more surface area to come into contact with subsequent gas mixtures to increase the formation of aluminum fluoride (see block 106). The anisotropic process facilitates in avoiding sidewall damage by directing ions to the bottom of the vias. The anisotropic process may incorporate a bias electrode 310 in a substrate support 314 and a bias power source 312 to increase directivity of ions produced by the direct plasma 304. In some embodiments, helium gas 318 from a first gas supply source 316 is used in the direct plasma 304 to produce helium ions 308 that are then directed to the bottom of the via 204 to roughen 302 the portion 210A of the etch stop layer 210. In some embodiments, the duration of the ion bombardment may be from approximately 10 seconds to approximately 30 seconds.

Figure 4:
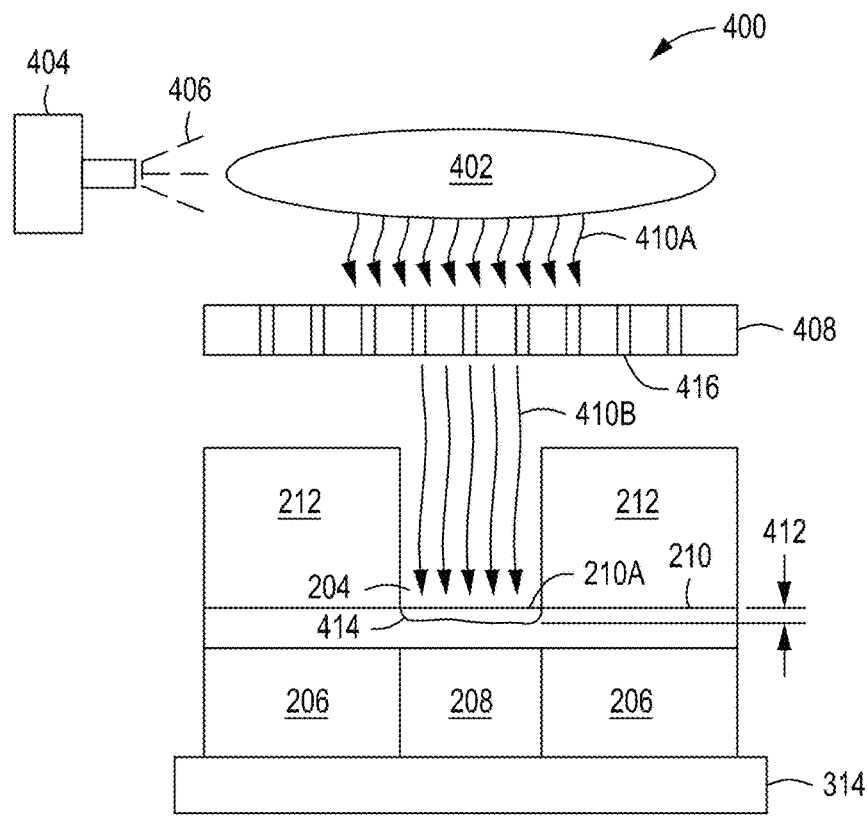
FIG. 4 depicts a cross-sectional view of formation of aluminum fluoride in a bottom of a via in accordance with some embodiments of the present principles.

In block 106, aluminum fluoride 414 is formed on the portion 210A of the etch stop layer 210 using remote plasma 402 in conjunction with, at least, nitrogen trifluoride ($NF_3$) gas 406 from a second gas supply 404 as depicted in a view 400 of FIG. 4. The nitrogen trifluoride in plasma provides a source of fluoride atoms 410A which are guided (either through a funnel system from a remote reactor or by passageways 416 in an ion screen/showerhead 408 in a direct/remote plasma chamber—see FIG. 11) from the remote plasma 402 to the portion 210A of the etch stop layer 210 at the bottom of the via 204. The bombardment by the guided fluoride atoms 410B causes formation of the aluminum fluoride 414 in the portion 210A of the etch stop layer 210. In some embodiments, the duration of the atom bombardment may be from approximately 10 seconds to approximately 30 seconds. In some embodiments, a thickness 412 of the aluminum fluoride 414 in the portion 210A of the etch stop layer 210 is approximately 5 angstroms to approximately 10 angstroms during a single cycle of the etch stop layer removal process 126. In some embodiments with an etch stop layer material of aluminum monoxide, the nitrogen trifluoride gas 406 may be combined with a helium carrier gas in a hydrogen gas environment to form the aluminum fluoride 414 in the portion 210A of the etch stop layer 210, allowing the oxygen from the aluminum monoxide to combine with the hydrogen to form $H_2O$ while the aluminum from the aluminum monoxide combines with the fluoride atoms to form the aluminum fluoride 414.

Figure 5:
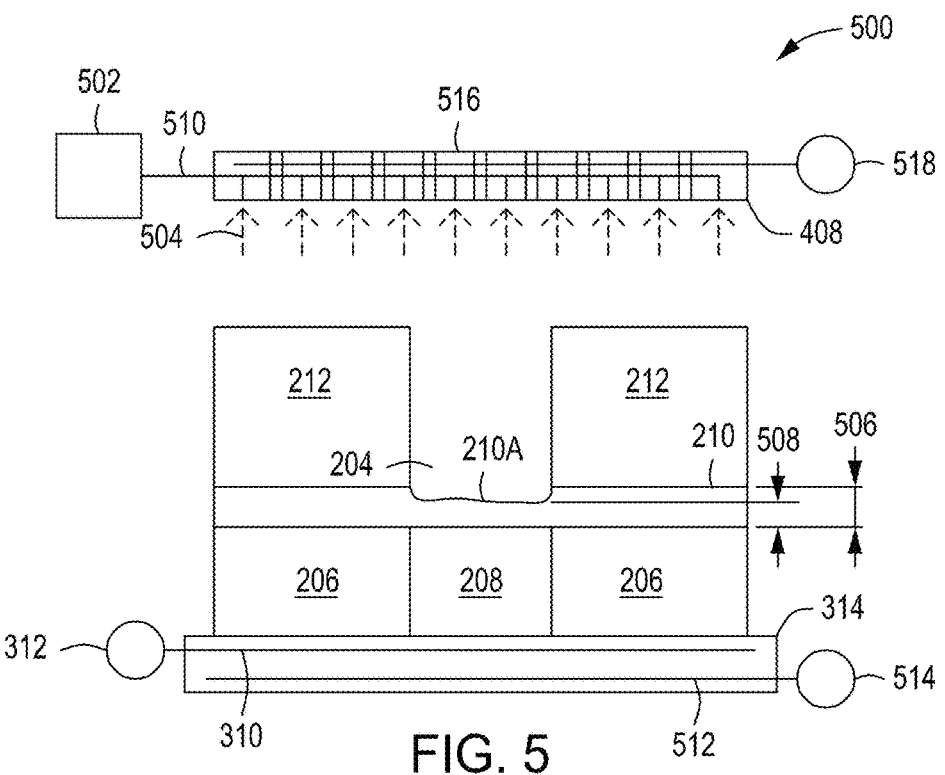
FIG. 5 depicts a cross-sectional view of removal of aluminum fluoride in a bottom of a via in accordance with some embodiments of the present principles.
Figure 6:
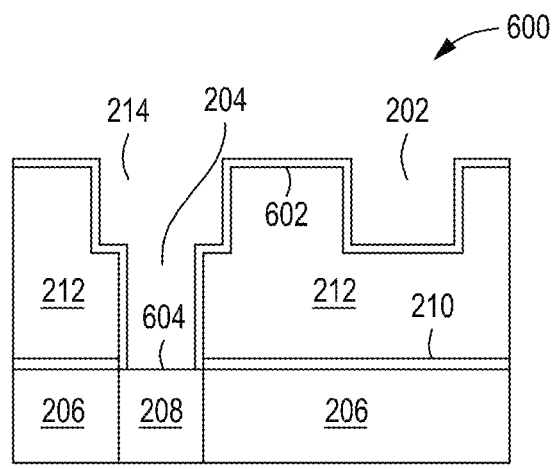
FIG. 6 depicts a cross-sectional view of a dual damascene via and line after deposition of a barrier layer in accordance with some embodiments of the present principles.

In block 108, the portion 210A of the etch stop layer 210 is exposed to a gas mixture 504 from a third gas supply 502 to remove the aluminum fluoride 414 and reduce a first thickness 506 of the portion 210A of the etch stop layer 210 to a second thickness 508 as depicted in a view 500 of FIG. 5. The removal of the aluminum fluoride 414 is a dry etch process which helps prevent damage to low K materials. In some embodiments, approximately 5 angstroms to approximately 10 angstroms of the thickness of the portion 210A of the etch stop layer 210 is removed during a single cycle of the etch stop layer removal process 126. In some embodiments, the gas mixture 504 may be delivered through gas passageways 510 in the ion screen/showerhead 408. In some embodiments, the exposure of the portion 210A of the etch stop layer 210 with the gas mixture 504 is accomplished in a temperature of approximately 100 degrees Celsius to approximately 350 degrees Celsius. The higher the temperature, the higher the rate of removal. In some embodiments, the substrate may be heated by a first heater 512 in the substrate support 314 with AC power supplied by a first AC power source 514 and/or by heating the gas mixture 504 with a second heater 516 in the ion screen/showerhead 408 powered by a second AC power source 518. In some embodiments, the duration of the exposure of the gas mixture 504 in the heated environment is approximately 30 seconds to approximately 60 seconds. No plasma or ions are formed during the exposure process which eliminates or reduces any potential corrosion from occurring. In some embodiments, the gas mixture 504 may comprise boron trichloride ($BCl_3$), trimethylaluminum ($Al_2(CH_3)_6$ or TMA), and/or dimethylaluminum chloride ($(CH_3)_2AlCl$ or DMAC) and the like.

The etch stop layer removal process 126 of roughening, forming aluminum fluoride, and removing aluminum fluoride may be repeated 124 until the portion 210A of the etch stop layer 210 is removed, exposing the underlying metallization material 208. In some embodiments, the etch stop removal process may be repeated three to five times to ensure removal of the etch stop and exposure of the metallization material 208. In some embodiments, one or more onboard (in situ) metrology sensors may be used to detect the opening of the etch stop layer 210 in the via 204. The onboard metrology sensors allow determination of the status of the etch stop layer without requiring a vacuum break in the processes. If the etch stop layer 210 is not detected by the onboard metrology sensor to be open, the etch stop layer removal process 126 can be repeated until the onboard metrology sensor detects that the etch stop layer is open. In some embodiments, the onboard metrology sensor may include spectroscopic sensors and/or electron beam sensors. In optional block 110, after the etch stop layer 210 is opened, the dielectric materials may be passivated with hydrogen gas and/or $H_2O$ passivation processes to prevent any corrosion of the exposed metallization material from occurring due to residual chemistry on the dielectric materials.

Figure 10:
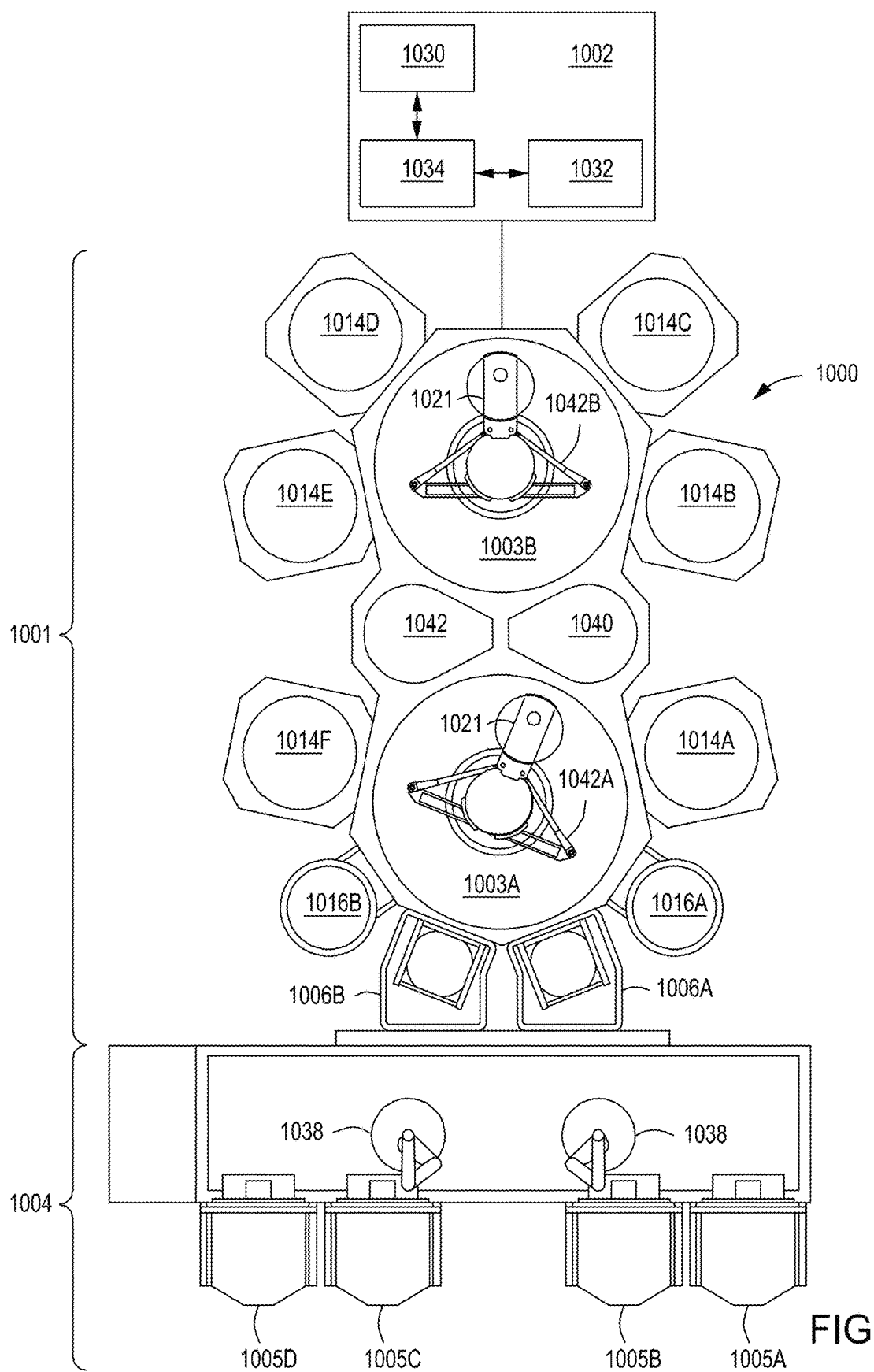
FIG. 10 depicts a top-down view of an integrated tool configured to perform operations on damascene structures in accordance with some embodiments of the present principles.

Once the etch stop layer 210 is open, the substrate can immediately proceed to the metallization processes 128 while remaining in a vacuum state in an integrated tool as shown in FIG. 10. In some embodiments, the integrated tool is under ultra-high vacuum (less than 1e-5 Torr) to prevent corrosion or oxidation of the substrate surfaces. The following metallization processes 128 are meant to be exemplary and are not intended to be exhaustive as the etch stop layer removal process 126 is compatible with metallization processes in general, allowing a unique combination of etch stop removal and metallization in an integrated tool without vacuum breaks. In block 112, the substrate is degassed and precleaned as necessary. In some embodiments, gas combinations such as hydrogen gas, nitrogen gas and hydrogen gas, ammonia gas, and/or nitrogen trifluoride and the like may be used in a pre-clean process to reduce metal oxide on the substrate. In block 114, a barrier layer 602 is deposited by selective deposition or reverse selective deposition on the substrate in the via 204, the first trench 214, and the second trench 202 as depicted in a view 600 of FIG. 6. The bottom 604 of the via 204 is not coated with the barrier layer 602 as part of the selective/reverse selective deposition process. The barrier layer 602 may be a tantalum nitride (TaN) material or a titanium nitride (TiN) material and the like.

Figure 7:
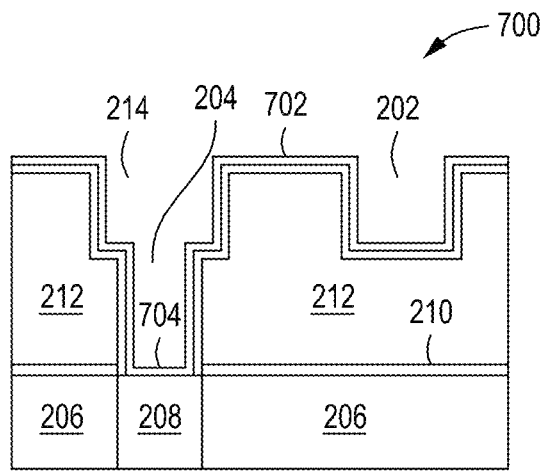
FIG. 7 depicts a cross-sectional view of a dual damascene via and line after deposition of a liner layer on the barrier layer in accordance with some embodiments of the present principles.
Figure 8:
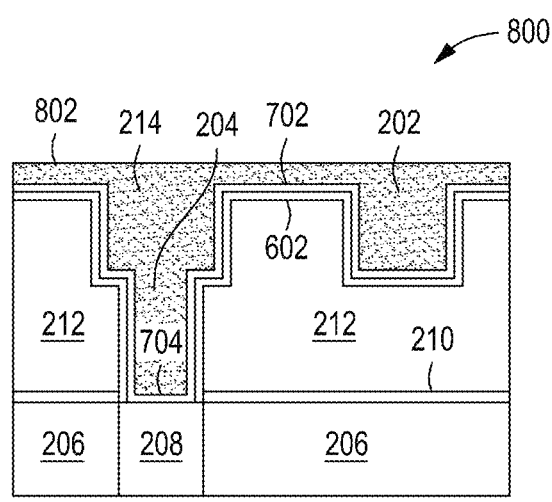
FIG. 8 depicts a cross-sectional view of a dual damascene via and line after deposition and reflow of a gapfill metal or metals in accordance with some embodiments of the present principles.
Figure 9:
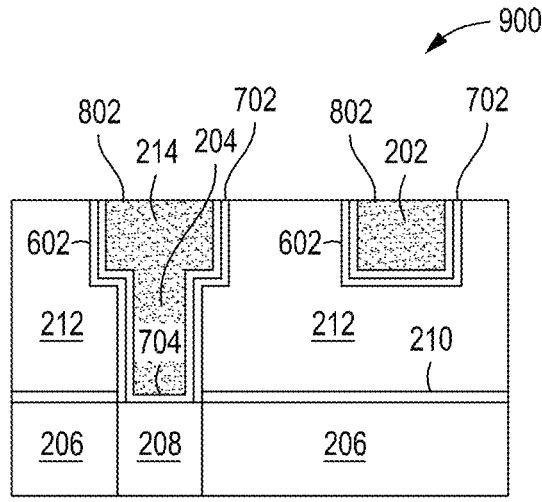
FIG. 9 depicts a cross-sectional view of a dual damascene via and line after a chemical mechanical process in accordance with some embodiments of the present principles.

In block 116, a liner layer 702 is deposited on the substrate in the via 204, the first trench 214, and the second trench 202 as depicted in a view 700 of FIG. 7. The liner layer 702 is deposited on the bottom 704 of the via 204 on the metallization material 208. The liner layer 702 may be a material such as, but not limited to, cobalt or ruthenium and may include multiple layers. In block 118, one or more metallization materials 802 is deposited on the substrate in the via 204, the first trench 214, and the second trench 202. The deposition of the metallization materials 802 may include more than one deposition process and/or one or more intervening reflow/anneal processes between depositions and the like. The metallization materials 802 may or may not include dopants and the like to enhance the interconnect performance. In block 120, the substrate is annealed to cause reflow of the metallization materials and gapfilling of the via 204, the first trench 214, and the second trench 202 as depicted in a view 800 of FIG. 8. After the etch stop layer removal processes 126 and the metallization processes 128 have completed, in block 122, the substrate is removed from the integrated tool to allow a chemical mechanical polishing (CMP) process to be performed on the substrate to remove overburden as depicted in a view 900 of FIG. 9. The CMP process removes the extra material from the top surface of the substrate to allow for subsequent processing.

Figure 11:
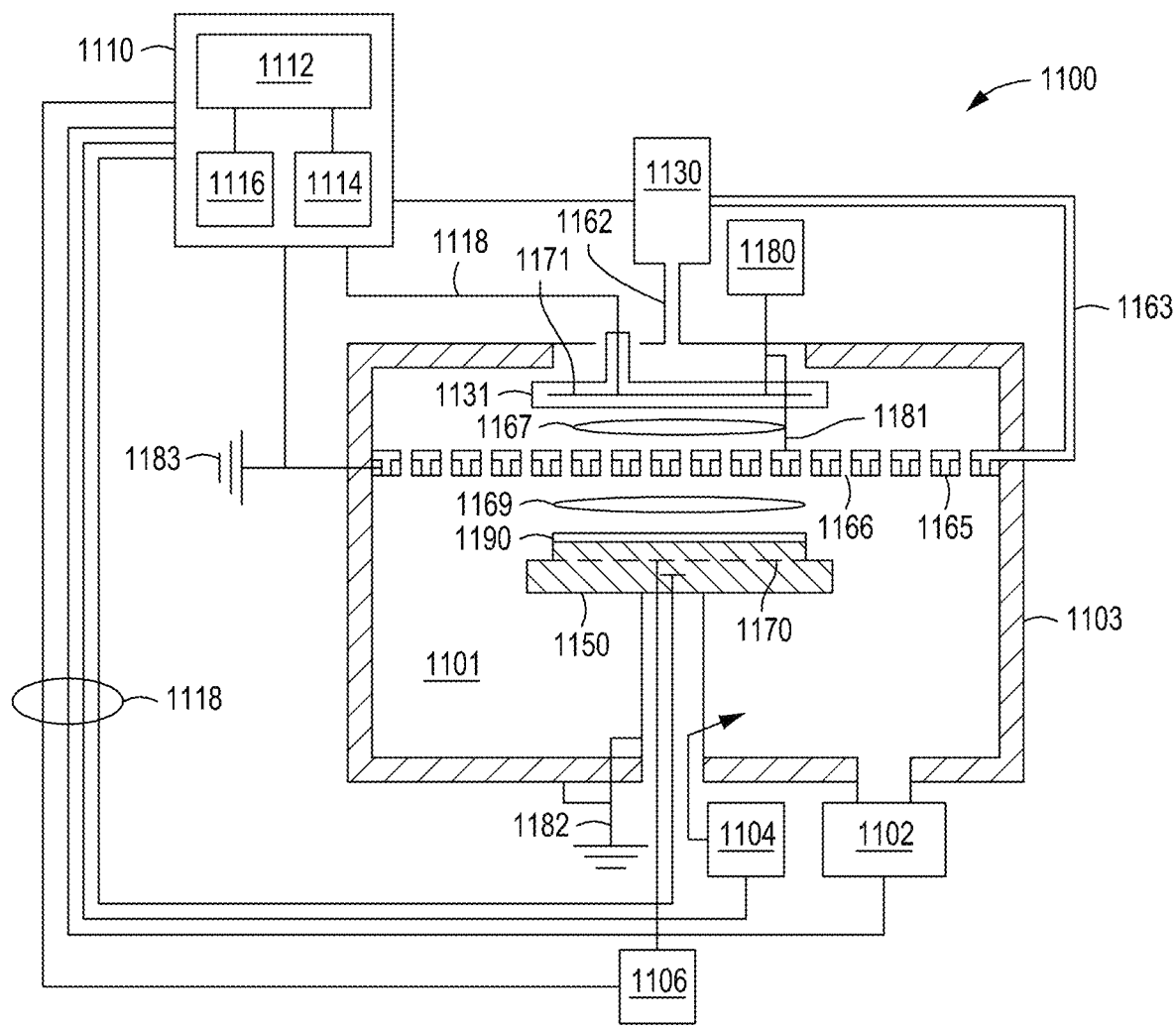
FIG. 11 depicts a cross-sectional view of a chamber configured to perform some operations on damascene structures in accordance with some embodiments of the present principles.
Figure 12:
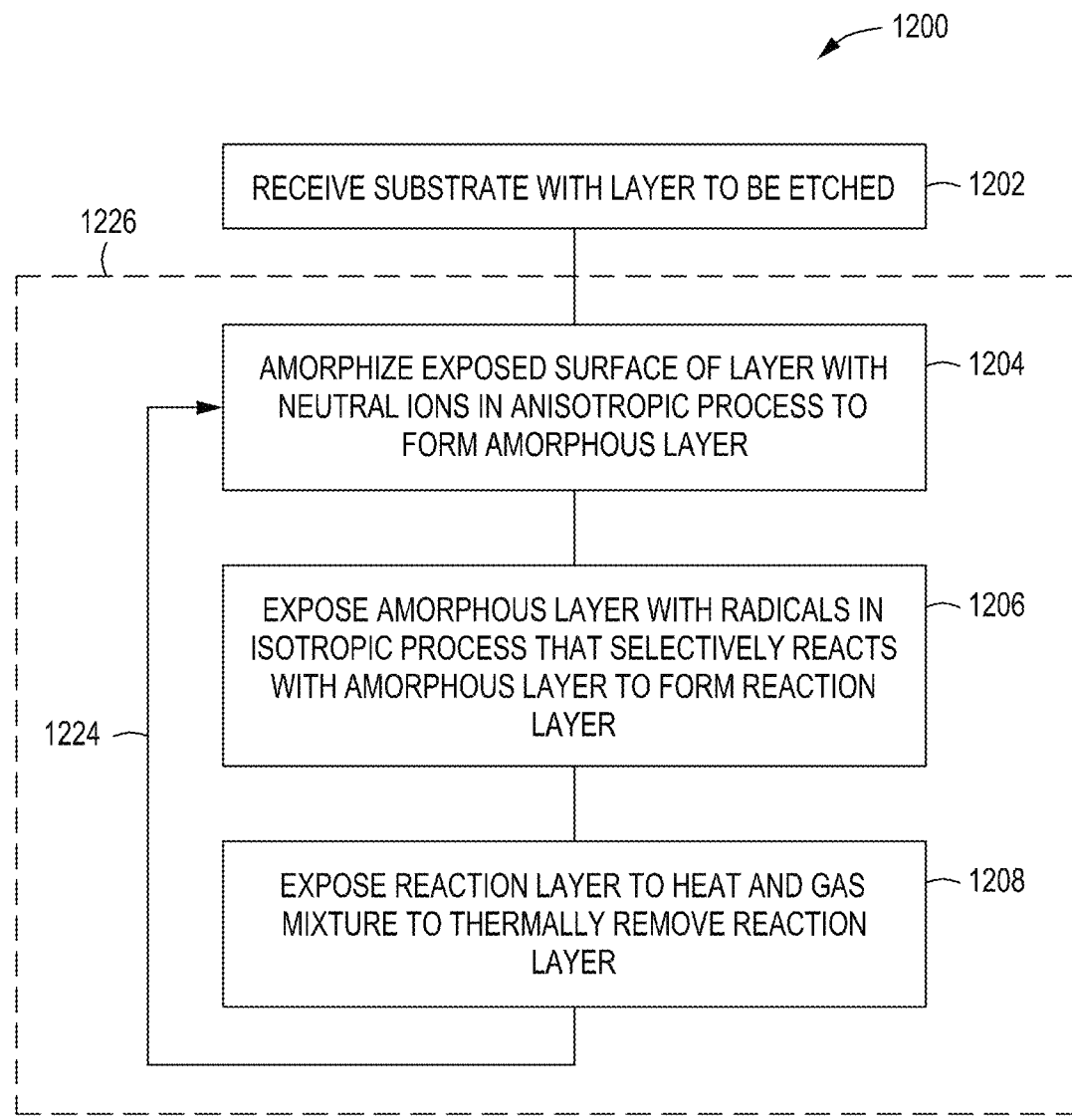
FIG. 12 is a method of etching exposed layers of structures on a substrate in accordance with some embodiments of the present principles.

The etch stop layer removal process 126 of method 100 may be further expanded into a layer etching and removal process 1226 such as method 1200 of FIG. 12. The method 1200 may be performed using similar hardware as that utilized by the method 100. Whereas the method 100 has a goal of removing the etch stop layer to reveal underlying metallization, the method 1200 may be utilized to also perform partial etches into various material layers, increasing the utility of the process. The method 1200 may be performed in the substrate processing system 1100 of FIG. 11 and also in the integrated tool 1000 of FIG. 10. In block 1202, a substrate with a layer to be etched is received. The layer may comprise a material such as, but not limited to, aluminum monoxide, silicon nitride, silicon dioxide, and the like. In some embodiments, only an exposed surface of the layer on the substrate is etched. In block 1204, the exposed surface of the layer is amorphized by exposing the surface to neutral ions in an anisotropic process to form an amorphous layer on the exposed surface of the layer. The anisotropic ion bombardment of the neutral ions aids in eliminating or reducing sidewall damage and the like when, for example, the exposed surface of the layer is positioned at the bottom of an opening on the substrate. In some embodiments, the neutral ions may include, but are not limited to, helium ions, hydrogen ions, and/or argon ions and the like. The formation of the amorphous layer increases the reaction levels with subsequent exposure to gas mixtures. The formation of the amorphous layer also increases selectivity of the amorphous layer over sidewall materials and the like when the amorphous layer is positioned at the bottom of an opening on the substrate.

The anisotropic process facilitates in avoiding sidewall damage by directing ions to the bottom of the openings. The anisotropic process may incorporate, as illustrated in FIG. 3, a bias electrode 310 in a substrate support 314 and a bias power source 312 to increase directivity of the neutral ions produced by the direct plasma 304. In some embodiments, neutral gases such as, for example but not limited to, helium gas 318 from a first gas supply source 316 is used in the direct plasma 304 to produce helium ions 308 that are then directed to the bottom of the openings to form the amorphous layer. In some embodiments, the duration of the neutral ion bombardment may be from approximately 10 seconds to approximately 30 seconds.

In block 1206, the amorphous layer is exposed to radicals in an isotropic process that selectively reacts with the amorphous layer to form a reaction layer. The radicals are formed using remote plasma in conjunction with a first gas mixture. In some embodiments, the first gas mixture may include AlF, SiNF, SiNCl, and/or SiOF based chemistries and the like. The gas mixture in plasma provides a source of radicals which are guided (either through a funnel system from a remote reactor or by passageways 416 in an ion screen/showerhead 408 in a direct/remote plasma chamber—see FIG. 11) from the remote plasma 402 to the reaction layer. The bombardment by the radicals causes formation of the reaction layer. In some embodiments, the duration of the radical exposure may be from approximately 10 seconds to approximately 30 seconds. In some embodiments, a thickness of the reaction layer is approximately 5 angstroms to approximately 10 angstroms during a single cycle of the layer etch and removal process 1226. The isotropic process is non-directional but selective to the amorphous layer due to the amorphous layer having greater exposed surface area and reactivity to the radicals.

In block 1208, the reaction layer is exposed to heat and a second gas mixture to thermally remove the reaction layer. The thermal removal process is highly selective to the reaction layer and without damage to other materials as no plasma is used. In some embodiments, the second gas mixture may include AlF/AlF vapor/AlFCH$_3$, and/or AlClF based chemistries and the like. The removal of the reaction layer is a dry etch process which helps prevent damage to low K materials. In some embodiments, approximately 5 angstroms to approximately 10 angstroms of the thickness of the reaction layer is removed during a single cycle of the layer etch and removal process 1226. In some embodiments, the second gas mixture may be delivered through gas passageways 510 in the ion screen/showerhead 408. In some embodiments, the exposure of the reaction layer with the second gas mixture is accomplished in a temperature of approximately 100 degrees Celsius to approximately 350 degrees Celsius. The higher the temperature, the higher the rate of removal. In some embodiments, the substrate may be heated by a first heater 512 in the substrate support 314 with AC power supplied by a first AC power source 514 and/or by heating the second gas mixture with a second heater 516 in the ion screen/showerhead 408 powered by a second AC power source 518. In some embodiments, the duration of the exposure of the second gas mixture in the heated environment is approximately 30 seconds to approximately 60 seconds. No plasma or ions are formed during the exposure process which eliminates or reduces any potential corrosion from occurring.

The layer etch and removal process 1226 may be repeated 1224 until the layer is removed. In some embodiments, the layer etch and removal process 1226 may be repeated three to five times to ensure removal of the layer and/or to reach a particular depth within the layer. In some embodiments, one or more onboard (in situ) metrology sensors may be used to detect the status of the etching of the layer. The onboard metrology sensors allow determination of the status of the etching without requiring a vacuum break in the processes. If the etching goal is not detected by the onboard metrology sensor as having been reached, the layer etch and removal process 1226 can be repeated until the onboard metrology sensor detects that the etching goal is achieved. In some embodiments, the onboard metrology sensor may include spectroscopic sensors and/or electron beam sensors. When the layer etch and removal process 1226 has reached the etching goal, one or more other processes such as the processes depicted in the method 100 may be performed afterward such as the processes in blocks 110 to 122.

The methods for etch stop layer removal and metallization described herein may be performed in individual process chambers that may be provided in a standalone configuration or as part of a cluster tool, for example, an integrated tool 1000 (i.e., cluster tool) described below with respect to FIG. 10. The advantage of using an integrated tool 1000 is that there is no vacuum break and, therefore, no requirement to degas and wet pre-clean a substrate before treatment. In some embodiments, the methods discussed above may advantageously be performed in an integrated tool such that there are limited or no vacuum breaks between processes. For example, reduced vacuum breaks may limit or prevent contamination of the substrate such as after removing portions of an etch stop layer in a bottom of a via. If the etch stop layer is removed in the integrated tool instead of prior to receipt of the substrate by the integrated tool, the queue time can be eliminated as well as any cleaning and preparation needed to remove corrosion or oxide on the via bottom caused by atmosphere exposure. The integrated tool 1000 includes a processing platform 1001 that is vacuum-tight, a factory interface 1004, and a system controller 1002.

The processing platform 1001 comprises multiple processing chambers, such as 1014A, 1014B, 1014C, 1014D, 1014E, and 1014F operatively coupled to a vacuum substrate transfer chamber (transfer chambers 1003A, 1003B). The factory interface 1004 is operatively coupled to the transfer chamber 1003A by one or more load lock chambers (two load lock chambers, such as 1006A and 1006B shown in FIG. 10).

In some embodiments, the factory interface 1004 comprises at least one docking station 1007, at least one factory interface robot 1038 to facilitate the transfer of the semiconductor substrates. The docking station 1007 is configured to accept one or more front opening unified pod (FOUP). Four FOUPS, such as 1005A, 1005B, 1005C, and 1005D are shown in the embodiment of FIG. 10. The factory interface robot 1038 is configured to transfer the substrates from the factory interface 1004 to the processing platform 1001 through the load lock chambers, such as 1006A and 1006B. Each of the load lock chambers 1006A and 1006B have a first port coupled to the factory interface 1004 and a second port coupled to the transfer chamber 1003A. The load lock chamber 1006A and 1006B are coupled to a pressure control system (not shown) which pumps down and vents the load lock chambers 1006A and 1006B to facilitate passing the substrates between the vacuum environment of the transfer chamber 1003A and the substantially ambient (e.g., atmospheric) environment of the factory interface 1004. The transfer chambers 1003A, 1003B have vacuum robots 1042A, 1042B disposed in the respective transfer chambers 1003A, 1003B. The vacuum robot 1042A is capable of transferring substrates 1021 between the load lock chamber 1006A, 1006B, the processing chambers 1014A and 1014F and a cooldown station 1040 or a pre-clean station 1042. The vacuum robot 1042B is capable of transferring substrates 1021 between the cooldown station 1040 or pre-clean station 1042 and the processing chambers 1014B, 1014C, 1014D, and 1014E.

In some embodiments, the processing chambers 1014A, 1014B, 1014C, 1014D, 1014E, and 1014F are coupled to the transfer chambers 1003A, 1003B. The processing chambers 1014A, 1014B, 1014C, 1014D, 1014E, and 1014F comprise at least a first chamber with a remote plasma source, a direct plasma source, and a thermal source configured to open an etch stop layer on a substrate by etching the etch stop layer with an anisotropic process using direct plasma to form helium ions that are configured to roughen the etch stop layer, forming aluminum fluoride on the etch stop layer using remote plasma and nitrogen trifluoride gas, and exposing the etch stop layer to a gas mixture of boron trichloride, trimethylaluminum, and/or dimethylaluminum chloride at a temperature of approximately 100 degrees Celsius to approximately 350 degrees Celsius to remove aluminum fluoride from the etch stop layer and a portion of a material of the etch stop layer; a second chamber with dry etch processing configured to pre-clean a metal surface exposed by opening the etch stop layer; a third chamber configured to deposit a barrier layer on the substrate; a fourth chamber of the integrated tool configured to deposit a liner layer on the substrate; at least one fifth chamber of the integrated tool configured to deposit metallization material on the substrate; at least one onboard metrology sensor to detect if the etch stop layer is open on the substrate; and at least one of the chambers is an atomic layer deposition chamber, a chemical vapor deposition chamber, or a plasma vapor deposition chamber. Additional chambers may also be provided such as chemical vapor deposition (CVD) chambers, annealing chambers, atomic layer deposition (ALD) chambers, plasma vapor deposition (PVD) chambers, or the like. ALD and PVD chambers may include any chambers suitable to perform all or portions of the methods described herein, as discussed above. In some embodiments, one or more optional service chambers (shown as 1016A and 1016B) may be coupled to the transfer chamber 1003A. The service chambers 1016A and 1016B may be configured to perform other substrate processes, such as degassing, orientation, substrate metrology such as, but not limited to, e-beam, spectroscopic, and/or other metrology apparatus and methods, cool down and the like. Metrology sensors may be placed within a chamber and/or in a buffer and/or load lock and the like and interface with a chamber controller and/or a system controller.

The system controller 1002 controls the operation of the integrated tool 1000 using a direct control of the process chambers 1014A, 1014B, 1014C, 1014D, 1014E, and 1014F or alternatively, by controlling the computers (or controllers) associated with the process chambers 1014A, 1014B, 1014C, 1014D, 1014E, and 1014F and the integrated tool 1000. In operation, the system controller 1002 enables data collection and feedback from the respective chambers and systems to optimize performance of the integrated tool 1000. The system controller 1002 generally includes a Central Processing Unit (CPU) 1030, a memory 1034, and a support circuit 1032. The CPU 1030 may be any form of a general-purpose computer processor that can be used in an industrial setting. The support circuit 1032 is conventionally coupled to the CPU 1030 and may comprise a cache, clock circuits, input/output subsystems, power supplies, and the like. Software routines, such as a method as described above may be stored in the memory 1034 and, when executed by the CPU 1030, transform the CPU 1030 into a specific purpose computer (system controller 1002). The software routines may also be stored and/or executed by a second controller (not shown) that is located remotely from the integrated tool 1000.

The memory 1034 is in the form of computer-readable storage media that contains instructions, when executed by the CPU 1030, to facilitate the operation of the semiconductor processes and equipment. The instructions in the memory 1034 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

FIG. 11 is a schematic illustration of an apparatus such as substrate processing system 1100 suitable for practicing at least a portion of the methods of the present disclosure. The substrate processing system 1100 may be a chamber included in the integrated tool discussed above for FIG. 10 to allow the substrate to have etch stop layer removal and metallization processes performed together without a vacuum break. In some embodiments, the substrate processing system 1100 includes a process chamber 1103, a gas panel 1130, a control unit 1110, along with other hardware components such as power supplies and vacuum pumps. Exemplary process chambers may include any of several process chambers configured for remote and direct plasma reactions such as chambers described herein.

In some embodiments, the process chamber 1103 generally comprises a lid heater 1131, which is used to heat processing volume 1101 including a region such as a plenum space between lid heater 1131 and showerhead 1165 within the process chamber 1103 in which remote plasma 1167 may be formed. The showerhead 1165 may be a combination showerhead and ion screen such as the ion screen/showerhead 408. The showerhead 1165 may also include passageways 1166 for ion transmission/guidance similar to passageways 416. Depending on the specific process, processing volume 1101 in a region between lid heater 1131 and showerhead 1165 may be heated to some desired temperature prior to and during processing in accordance with the present disclosure. In some embodiments, the lid heater 1131 is heated by an embedded heating element such as heating element 1171. For example, lid heater 1131 may be resistively heated by applying an electric current from an AC supply (not shown) to the heating element 1171. The processing volume 1101 region between lid heater 1131 and showerhead 1165 is, in turn, heated by the lid heater 1131. The showerhead 1165 may also contain heating elements. In some embodiments, the region between the lid heater and the showerhead is characterized as a plenum space. In some embodiments, the lid heater 1131 is configured to provide heat sufficient to promote remote plasma formation between lid heater 1131 and showerhead 1165. For example, control unit 1110 may be in communication with the lid heater 1131 to adjust the heat of lid heater 1131 and maintain a heat sufficient for remote plasma formation. In some embodiments, depending upon processing needs, lid heater 1131 is configured not to heat, or promote remote plasma formation in a region between lid heater 1131 and showerhead 1165. For example, the lid heater 1131 may be switched off by way of control unit 1110 depending upon user needs.

In some embodiments, a radio frequency electrode 1181 may be embedded in the lid heater 1131 to configure the lid heater 1131 for providing radio frequency in an amount sufficient to form a plasma adjacent the lid heater 1131. In some embodiments, the lid heater 1131 is configured to provide RF sufficient to promote remote plasma formation in processing volume 1101 in a region between lid heater 1131 and showerhead 1165. For example, control unit 1110 may be in communication with the lid heater 1131 to adjust the RF emitted from lid heater 1131 and maintain RF signal sufficient for plasma formation. In some embodiments, depending upon processing needs, lid heater 1131 is configured not to emit RF signal or promote plasma formation in processing volume 1101 between lid heater 1131 and showerhead 1165. For example, the lid heater 1131 may be switched off by way of control unit 1110 depending upon user needs eliminating RF generated therefrom. In some embodiments, the process chamber 1103 generally includes a support pedestal 1150, which is used to support a substrate such as a substrate 1190 within the process chamber 1103. The support pedestal 1150 can be moved in a vertical direction inside the process chamber 1103 using a displacement mechanism (not shown). Depending on the specific process, substrate 1190 may be heated to some desired temperature prior to processing. In some embodiments, the support pedestal 1150 is heated by an embedded heating element such as heating element 1170. For example, the support pedestal 1150 may be resistively heated by applying an electric current from an AC supply 1106 to the heating element 1170. The substrate 1190 is, in turn, heated by the support pedestal 1150. In some embodiments, the support pedestal includes a ground at 1182.

In some embodiments, proper control and regulation of gas flows through the process chamber 1103 and gas panel 1130 is performed by mass flow controllers (not shown) and a controller unit 1110 such as a computer. The showerhead 1165 allows process gases from the gas panel 1130 to be uniformly distributed and introduced into the process chamber 1103. In some embodiments, showerhead 1165 is configured for flowing reaction products. Illustratively, the control unit 1110 includes a central processing unit (CPU) 1112, support circuitry 1114, and memories containing associated control software 1116. The control unit 1110 is responsible for automated control of the numerous processes required for substrate 1190 processing such as substrate transport, gas flow control, temperature control, chamber evacuation, and so on. Bi-directional communications between the control unit 1110 and the various components of the substrate processing system 1100 are handled through numerous signal cables collectively referred to as signal buses 1118, some of which are illustrated in FIG. 11.

In some embodiments, a radio frequency electrode 1181 may be embedded in the showerhead 1165 to configure the showerhead 1165 for providing RF energy in an amount sufficient to form a direct plasma 1169 adjacent and below the showerhead 1165. In some embodiments, the showerhead 1165 is configured to provide RF sufficient to promote plasma formation in processing volume 1101. For example, control unit 1110 may be in communication with the showerhead 1165 so that a user can adjust RF emitted from showerhead 1165 and maintain RF signal sufficient for plasma formation. In some embodiments, the showerhead 1165 may optionally be grounded by ground 1183 depending upon user needs for plasma placement within processing volume 1101. In some embodiments, wherein showerhead 1165 is grounded, a remote plasma may form in a region between lid heater 1131 and showerhead 1165 in processing volume 1101. In some embodiments, wherein showerhead is not grounded, the direct plasma 1169 is formed in a region between the showerhead 1165 and substrate 1190 in processing volume 1101.

A switch may be in communication with the ground 1183 and RF electrode 1180 and showerhead and configured to control remote and direct plasma formation in accordance with the present disclosure and depending upon user needs. In some embodiments, the switch may be a physical switch (not shown) and/or may be a part of a control unit 1110 or a system controller 1002. In some embodiments, the switch and showerhead 1165 are in communication and configured to control remote and direct plasma formation in accordance with the present disclosure and depending upon user needs. In some embodiments, a power supply such as an RF or VHF power supply, is electrically coupled to the chamber lid via a switch when the switch is disposed in a first position. When the switch is disposed in a second position the power supply is electrically coupled to the showerhead 1165. When the switch is in the first position, the power supply is used to ignite and maintain a first plasma which is remote from the substrate, such as a remote plasma disposed in the plenum space or region directly between the lid heater and showerhead. In some embodiments, a remote plasma is composed of the processing gases flowed into the plenum and maintained as a plasma by capacitive coupling of power from the power supply. In some embodiments, when the switch is in a second position, the power supply is used to ignite and maintain a second plasma in the processing volume 1101 between the showerhead 1165 and the substrate 1190 disposed on the substrate support.

In some embodiments, process chamber 1103 includes a vacuum pump 1102 to evacuate the process chamber 1103 and to maintain the proper gas flows and pressure inside the process chamber 1103. A showerhead 1165, through which process gases are introduced into the process chamber 1103, is located above the support pedestal 1150. In some embodiments, showerhead 1165 may be configured as a multiple gas showerhead having two or more separate pathways, which allow two or more gases to be separately introduced into the processing chamber 1103 without premixing. In some embodiments, showerhead 1165 is connected to a gas panel 1130 which controls and supplies, through mass flow controllers (not shown), various gases used in different steps of the process sequence. During substrate processing, a purge gas supply 1104 also provides a purge gas, for example, an inert gas, around the bottom of the support pedestal 1150 to minimize undesirable deposits from forming on the support pedestal 1150. In some embodiments, control unit 1110 is responsible for controlling gas flow from gas panel 1130 to the region between lid heater 1131 and showerhead 1165 by a first gas flow line 1162, or within showerhead 1165 by a second gas flow line 1163. In some embodiments, the flow rate, temperature, and pressure of the processing volume can be adjusted to a value sufficient for a reaction desired in accordance with the present disclosure. In some embodiments, such as where processing chamber 1103 is configured for direct plasma application, e.g., igniting plasma in a region between showerhead 1165 and substrate 1190, one or more desired gases may be directed from gas panel 1130 into processing volume 1101 via a first gas flow line 1162, and one or more desired gases may be directed to processing volume 1101 by second gas flow line 1163. In some embodiments, the flow rate, temperature, and pressure of the processing volume can be adjusted to a value sufficient for a reaction desired in accordance with the present disclosure.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for opening an etch stop layer prior to metallization, comprising:
   etching the etch stop layer with an anisotropic process using direct plasma to form helium ions that are configured to roughen the etch stop layer;
   forming aluminum fluoride on the etch stop layer using remote plasma and nitrogen trifluoride gas; and
   exposing the etch stop layer to a gas mixture at a temperature of approximately 100 degrees Celsius to approximately 350 degrees Celsius to remove aluminum fluoride from the etch stop layer reducing a thickness of a portion of a material of the etch stop layer.

2. The method of claim 1, wherein the gas mixture is one or more of boron trichloride, trimethylaluminum, and dimethylaluminum chloride.

3. The method of claim 1, further comprising:
   repeating the method for opening the etch stop layer three to five times.

4. The method of claim 1, further comprising:
   etching the etch stop layer for a first duration of approximately 10 seconds to approximately 30 seconds.

5. The method of claim 1, further comprising:
   forming aluminum fluoride on the etch stop layer for a second duration of approximately 10 seconds to approximately 30 seconds.

6. The method of claim 1, further comprising:
   exposing the etch stop layer to the gas mixture for a third duration of approximately 30 seconds to approximately 60 seconds.

7. The method of claim 1, further comprising:
   exposing the etch stop layer to the gas mixture without plasma or ions such that corrosion on the etch stop layer is inhibited.

8. The method of claim 1, further comprising:
   after opening the etch stop layer, using hydrogen gas and/or water passivation on a metal surface exposed by opening the etch stop layer to prevent corrosion of the metal surface.

9. The method of claim 1, wherein the etch stop layer is aluminum monoxide or silicon carbon nitride.

10. The method of claim 1, further comprising:
    performing metallization processes after the etch stop layer is opened.

11. The method of claim 10, further comprising:
    opening the etch stop layer and performing the metallization processes without a vacuum break in an integrated tool.

12. The method of claim 11, further comprising:
    detecting the opening of the etch stop layer using at least one onboard metrology sensor in the integrated tool.

13. The method of claim 1, further comprising:
    repeating the method of claim 1 after exposing the etch stop layer to the gas mixture if an onboard metrology sensor does not detect the opening of the etch stop layer; and
    stopping the method of claim 1 after exposing the etch stop layer to the gas mixture if the onboard metrology sensor detects the opening of the etch stop layer.

14. A method for etching a layer prior to metallization, comprising:
    amorphizing the layer with an anisotropic process using direct plasma to form neutral ions that are configured to form an amorphous layer;
    exposing the amorphous layer with radicals using remote plasma and a first gas mixture in an isotropic process, wherein the radicals selectively react with the amorphous layer to form a reaction layer; and
    exposing the reaction layer to a second gas mixture without plasma at a temperature of approximately 100 degrees Celsius to approximately 350 degrees Celsius to remove the reaction layer and reducing a thickness of the layer.

15. The method of claim 14, wherein the first gas mixture is one or more of AlF, SiNF, SiNCl, and SiOF gas-based chemistries and the second gas mixture is one or more of AlF, AlF vapor, AlFCH$_3$, and AlClF gas-based chemistries.

16. The method of claim 14, further comprising:
repeating the method for etching the layer three to five times.

17. The method of claim 14, further comprising:
performing metallization processes after the layer is etched.

18. The method of claim 17, further comprising:
etching the layer and performing the metallization processes without a vacuum break in an integrated tool.

19. The method of claim 14, further comprising:
repeating the method of claim 14 after exposing the reaction layer to the second gas mixture if an onboard metrology sensor does not detect that an etching goal has been achieved; and
stopping the method of claim 14 after exposing the reaction layer to the second gas mixture if the onboard metrology sensor detects the etching goal has been achieved.

20. A non-transitory, computer readable medium having instructions stored thereon that, when executed, cause a method for opening an etch stop layer prior to metallization to be performed, the method comprising:

etching the etch stop layer with an anisotropic process using direct plasma to form helium ions that are configured to roughen the etch stop layer for a first duration of approximately 10 seconds to approximately 30 seconds;

forming aluminum fluoride on the etch stop layer using remote plasma and nitrogen trifluoride gas for a second duration of approximately 10 seconds to approximately 30 seconds; and exposing the etch stop layer to a gas mixture at a temperature of approximately 100 degrees Celsius to approximately 350 degrees Celsius to remove aluminum fluoride from the etch stop layer reducing a thickness of a portion of a material of the etch stop layer for a third duration of approximately 30 seconds to approximately 60 seconds.

* * * * *